(12) United States Patent
Kawakita (10) Patent No.: US 8,080,470 B2
(45) Date of Patent: Dec. 20, 2011

(54) WIRING STRUCTURE AND SEMICONDUCTOR DEVICE, AND THEIR FABRICATION METHODS

(75) Inventor: Keizo Kawakita, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 410 days.

(21) Appl. No.: 12/141,664

(22) Filed: Jun. 18, 2008

(65) Prior Publication Data

US 2008/0308943 A1    Dec. 18, 2008

(30) Foreign Application Priority Data

Jun. 18, 2007  (JP) ................... 2007-160342

(51) Int. Cl.
*H01L 21/4763* (2006.01)

(52) U.S. Cl. ........ 438/618; 438/622; 438/637; 438/652; 438/675; 257/773; 257/E23.142; 257/E21.575

(58) Field of Classification Search .......... 438/618, 438/622, 240, 627, 778, 635, 652, 675, 637; 257/773, E23.142, E21.575
See application file for complete search history.

(56) References Cited

U.S. PATENT DOCUMENTS

| | | | |
|---|---|---|---|
| 6,774,029 B2 * | 8/2004 | Shin et al. ............... | 438/635 |
| 7,682,591 B2 * | 3/2010 | Black et al. ............... | 423/447.3 |
| 2004/0043219 A1 * | 3/2004 | Ito et al. ................. | 428/408 |
| 2004/0256662 A1 * | 12/2004 | Black et al. .............. | 257/317 |
| 2005/0164519 A1 * | 7/2005 | Katz ....................... | 438/778 |
| 2005/0196950 A1 * | 9/2005 | Steinhogl et al. ......... | 438/622 |
| 2005/0208430 A1 * | 9/2005 | Colburn et al. ........... | 430/313 |
| 2006/0163743 A1 * | 7/2006 | Kuwabara et al. ......... | 257/773 |
| 2006/0263642 A1 * | 11/2006 | Hieda et al. .............. | 428/826 |
| 2007/0184647 A1 * | 8/2007 | Furukawa et al. ......... | 438/622 |
| 2010/0003791 A1 * | 1/2010 | Maeda et al. ............. | 438/158 |

FOREIGN PATENT DOCUMENTS

| | | |
|---|---|---|
| JP | 2000-349329 A | 12/2000 |
| JP | 2003-45325 A | 2/2003 |
| JP | 2004-319523 A | 11/2004 |

* cited by examiner

*Primary Examiner* — Matthew Smith
*Assistant Examiner* — Wilner Jean Baptiste
(74) *Attorney, Agent, or Firm* — Sughrue Mion, PLLC (57) ABSTRACT

A fabrication method for a wiring structure of the present invention includes: a process of forming a conductive wiring layer; a process of forming a wiring pattern on the wiring layer; a process of forming an insulative wiring interlayer film between wires of the wiring pattern; and a process of forming a plurality of longitudinal hole-shaped fine pores in the wiring interlayer film in a thickness direction of the wiring interlayer film by etching with a mask including one of nano-particles and material including nano-particles.

12 Claims, 10 Drawing Sheets

WIRING STRUCTURE AND SEMICONDUCTOR DEVICE, AND THEIR FABRICATION METHODS

BACKGROUND OF THE INVENTION

1. Field of the Invention

This invention relates to semiconductor device technology, and in particular to a wiring structure, a semiconductor device and their fabrication methods which reduce the wiring capacitance in circuits where narrow gaps exist between wires.

Priority is claimed on Japanese Patent Application No. 2007-160342, filed on Jun. 18, 2007, the content of which is incorporated herein by reference.

2. Description of Related Art

Miniaturization of the wiring structures in integrated circuits is advancing in keeping with the large-scale integration of semiconductor devices. Because of these advancements, the gap between wires in a wiring structure becomes unusually narrow, and leakage currents between adjacent wires flow easily and wiring capacitance becomes great.

Methods exist which reduce the dielectric constant of a wiring interlayer insulating film for the purpose of reducing wiring capacitance. Generally, in order to achieve reductions of the wiring capacitance, an air gap structure having air gaps in wiring interlayer insulating films, a damascene structure configured by conducting wires and via holes (hereinafter they may be referred to as "vias"), a film which has doped carbon or fluorine in silicon, and the like, are used.

Japanese Unexamined Patent Application First Publication No 2000-349329, for example, discloses a memory element of diode construction in which a semiconductor porous microcrystal layer composed of nanocrystals is formed on a semiconductor substrate.

Japanese Unexamined Patent Application, First Publication No. 2003-45325 and Japanese Unexamined Patent Application, First Publication No. 2004-319523 disclose a method for depositing a microcrystal layer composed of nanometer size fine particles on a plurality of concave parts on an n-type silicon substrate using the PCVD (Plasma Chemical Vapor Deposition) method.

However, the air gap in conventional air gap structures is generally of spherically-shaped pores, and the effect is limited to the portion where the wire space is a minimum. When an oxide film is used, the relative dielectric constant of the portion of a wide space is in the range of 3.9-4.2 and cannot be changed with conventional technology.

When forming vias, the vias can be misaligned with the underlying wiring layer, abutting the air gap, so that metal of the via fills the air gap causing a short with adjacent vias. In order to avoid this shortcoming, it is necessary to establish a joint margin for the wire and via. This causes the problem that the wire pitch becomes large.

In a damascene structure, after forming a low dielectric constant film having fine pores, the groove structure of the via or wire is fabricated. In this case, there is a problem that moisture used during the fabrication process is absorbed within the low dielectric constant film.

When using a film of carbon or fluorine-doped silicon, the following problems exist: the working strength of the film becomes weak, the wet etch rate is reduced because of the damage incurred during processing, and the dielectric constant increases due to the absorption of moisture within the film.

SUMMARY OF THE INVENTION

The present invention takes the above circumstances into consideration. An object of the present invention is to provide a wiring structure, a semiconductor device and their fabrication methods which reduce wiring capacitance in circuits where the gaps between wires are narrow by reducing the dielectric constant of the entire wiring interlayer film without suffering from damage or influence in fabrication processes.

In order to solve the problems, the wiring structure of the present invention includes: a conductive wiring layer having a wiring pattern; and an insulative wiring interlayer film formed between wires of the wiring pattern, the wiring interlayer film having a plurality of longitudinal hole-shaped fine pores in a thickness direction of the wiring interlayer film.

According to this wiring structure, because the relative dielectric constant of the fine pores which are not filled is 1, the portion with relative dielectric lower than the relative dielectric of the insulating film can be formed in the wiring interlayer film, and thus, the relative dielectric constant between the wires as a whole is reduced. As a result, the capacitance between adjacent wires is reduced and thereby signal delays are suppressed.

In the wiring structure of the present invention, a diameter of the fine pores may be smaller than a depth of the fine pores.

According to this wiring structure, the diameter of the pores is smaller t its depth. Thus, there is no risk of a short with adjacent vias and there are no restrictions for layouts, and therefore, it becomes easier to design the wiring pattern.

In the wiring structure of the present invention, the wiring interlayer film may include a low dielectric constant film having a relative dielectric constant in a range of 2.8-4.1, and a portion of the fine pores may have a relative dielectric constant of 1.

According to this wiring structure, it is possible to realize an interlayer capacitance with a lower dielectric constant than the relative dielectric constant of the original wire in the wing structure.

The semiconductor device of the present invention has the wiring structure of the present invention and formed on a semiconductor substrate.

According to this semiconductor device, the relative dielectric constant of the wiring interlayer film is reduced, the capacitance between adjacent wires is reduced, and signal delays are suppressed. As a result, enhancement of device speed can be achieved.

The fabrication method for a wring structure of the present invention includes: a process of forming a conductive wiring layer; a process of forming a wiring pattern on the wiring layer; a process of forming an insulative wiring interlayer film between wires of the wiring pattern; and a process of forming a plurality of longitudinal hole-shaped fine pores in the wiring interlayer film in a thickness direction of the wiring interlayer film by etching with a mask including one of nano-particles and material including nano-particles.

According to the fabrication method for this wiring structure, it is possible to form a portion whose relative dielectric constant is lower than the relative dielectric constant of the insulating film in the wiring interlayer film because the relative dielectric constant of the fine pores which are not filled is 1. Thus, it is possible to lower the relative dielectric constant between the wires as a whole. As a result, the capacitance between adjacent wires be reduced and thereby signal delays can be suppressed.

In addition, according to the fabrication method for this wiring structure, it is possible to form fine pores by etching with a mask including one of nano-particles and material including nano-particles, without adding a photo mask process. Therefore, device characteristics can be improved without increasing cost.

In the fabrication method for the wiring structure of the present invention, the fine pores may be formed so that a diameter of the fine pores is smaller than a depth of the fine pores.

According to the fabrication method for this wiring structure, because the diameter of the fine pores is smaller than the depth of the fine pores, there is no risk of a short with adjacent vias and there are no restrictions for layouts, and therefore, it becomes easier to design the wiring pattern.

The fabrication method for the semiconductor device of the present invention includes a process of forming a wiring structure on a semiconductor substrate by using the fabrication method of the wiring structure of the present invention.

According to the fabrication method for this semiconductor device, because the relative dielectric constant of the wiring interlayer film can be reduced, the wiring capacitance can be reduced, and therefore signal delays can be suppressed. As a result enhancement of device speed can be achieved.

DETAILED DESCRIPTION OF THE INVENTION

Hereinafter, embodiments of the present invention are described, with reference to the drawings. The following drawings show the embodiments of a wiring structure, a semiconductor device, and their fabrication methods. The size, thickness or dimensions of each part shown in the drawings may differ from size, thickness, and dimensions of each part of the actual wiring structure, semiconductor device and their fabrication methods.

First Embodiment

An explanation is given, with reference to FIGS. 1-9, of the wiring structure, semiconductor device and their fabrication methods of a first embodiment of this invention which are applied to DRAM (Dynamic Random Access Memory).

Figure 1:
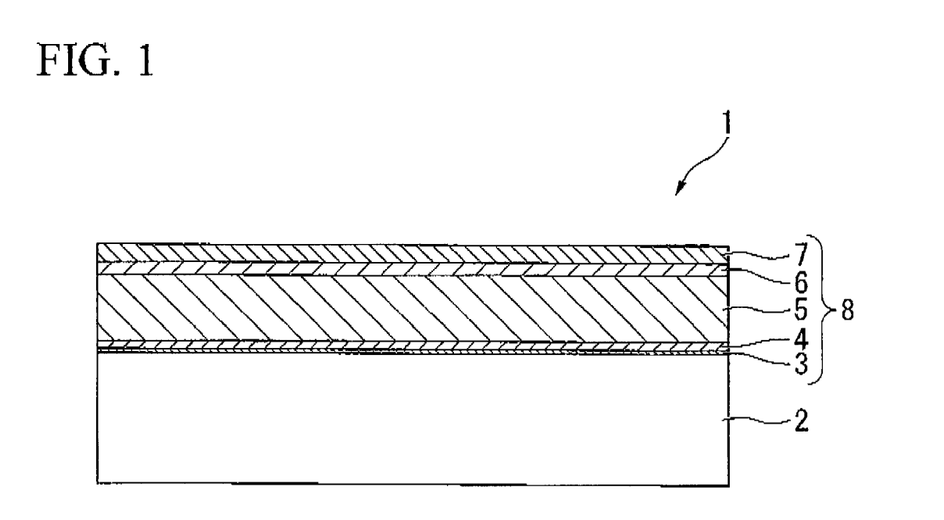
FIG. 1 is a process diagram for fabricating a semiconductor device related to a first embodiment of this invention and is a sectional view showing the state of a wiring layer being formed.

As shown in FIG. 1, after completing a stacked-type memory cell fabrication process in the DRAM, a wiring structure 8 is formed on a silicon oxide film which is deposited on a substrate as an insulating film 2 on a capacitor plate electrode. The wiring layer 8 is formed by depositing a Ti film 3, for example, to a thickness of 20 nm, a first TiN film 4 to 30 nm, a conductive layer 5 composed of aluminum, to 270 nm, a second TiN film 6 to 50 nm, and a silicon nitride film 7 to 50 nm.

The conductive film 5 is only required to be conductive and it is possible to use conductive metal material such as copper instead of aluminum.

Figure 2:
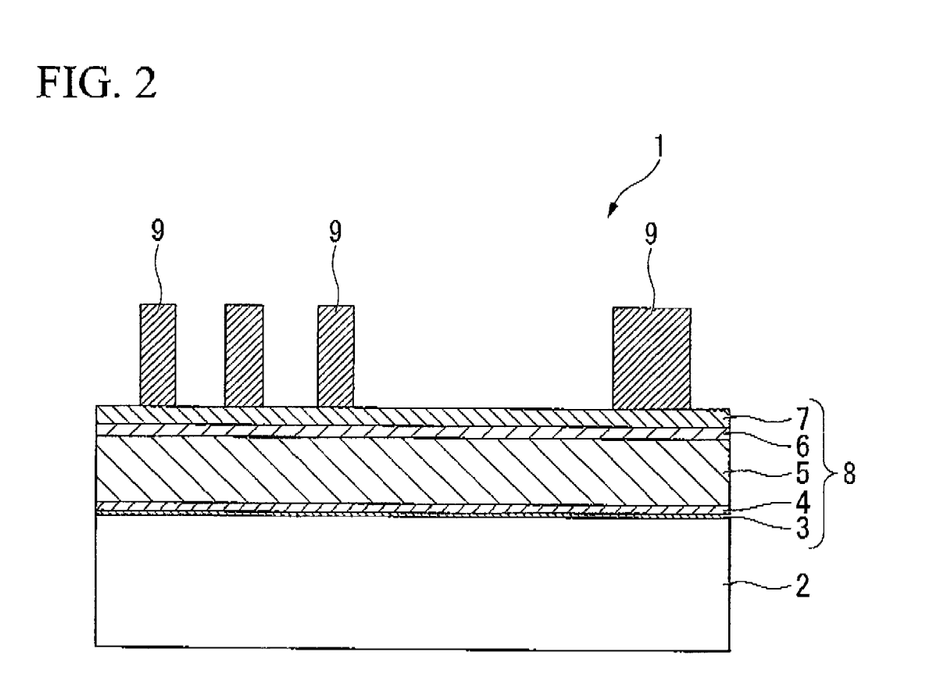
FIG. 2 is a process diagram for fabricating the semiconductor device related to the first embodiment of this invention and is a sectional view showing the state of a resist pattern being formed.

Next, as shown in FIG. 2, a normal lithographic process is performed. A resist layer is deposited on the silicon nitride film 7. This resist layer is patterned by exposure development processing to form a resist pattern 9.

Figure 3:
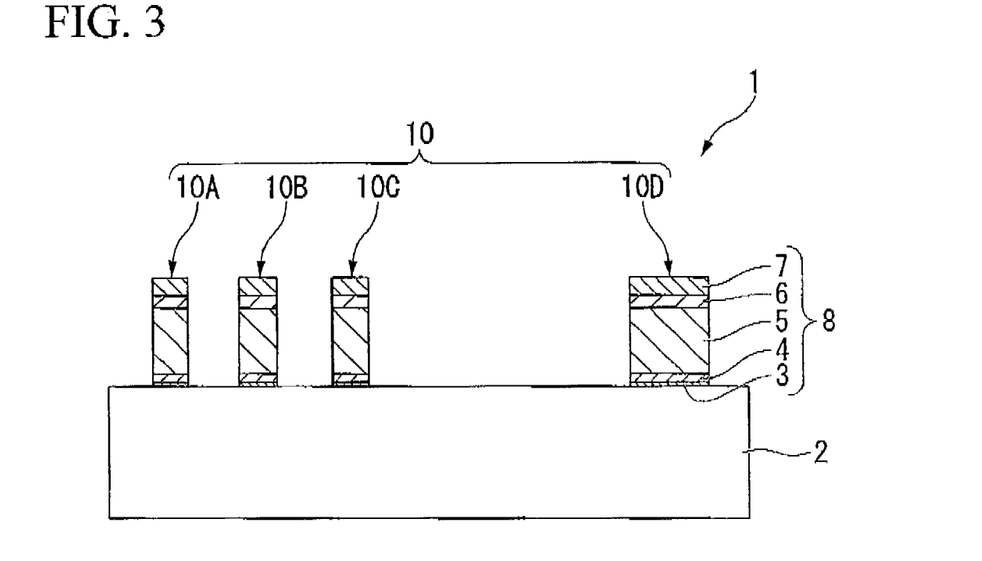
FIG. 3 is a process diagram for fabricating the semiconductor device related to the first embodiment of this invention and is a sectional view showing the state of a wiring pattern being formed.

Next, as shown in FIG. 3, with the resist pattern 9 as a mask, the wiring layer 8 is etched which is composed of the silicon nitride film 7, the second TiN film 6, the aluminum film 5, the first TiN film 4, and the Ti film 3. As a result, wires 10A, 10B, 10C, and 10D of the wiring pattern 10. The resist pattern 9 is then eliminated.

Figure 4:
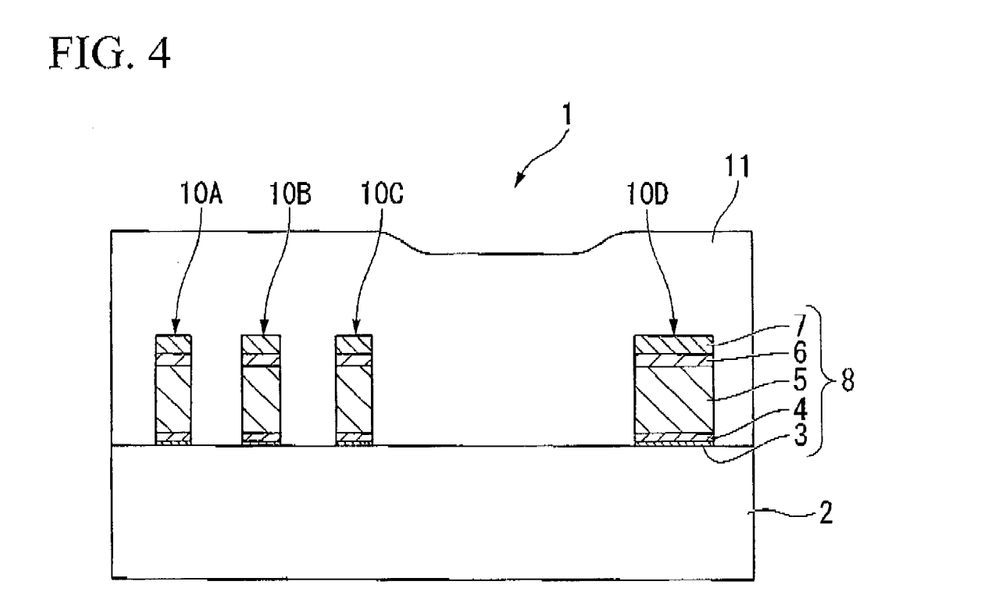
FIG. 4 is a process diagram for fabricating the semiconductor device related to the first embodiment of this invention and is a sectional view showing the state of a silicon oxide film being deposited.

Next, as shown in FIG. 4, a silicon oxide film is deposited by using, for example, the SOD (Spin on Dielectric coating) method to form a wiring interlayer film 11.

Figure 5:
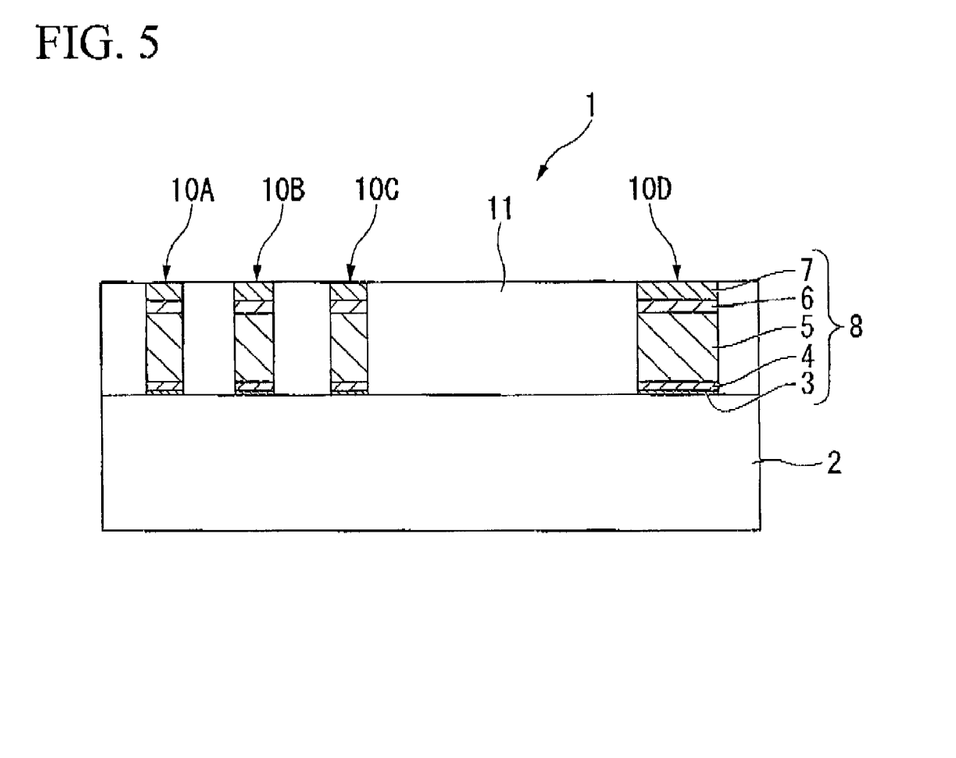
FIG. 5 is a process diagram for fabricating the semiconductor device related to the first embodiment of this invention and is a sectional view showing the state of the silicon oxide film being polished.

Then, as shown in FIG. 5, by using, for example, the CMP (Chemical Mechanical Polishing) method, the wiring interlayer film 11 is polished and eliminated up to the upper surface of the silicon nitride film 7, thereby flattening the surface of the substrate 1.

Figure 6:
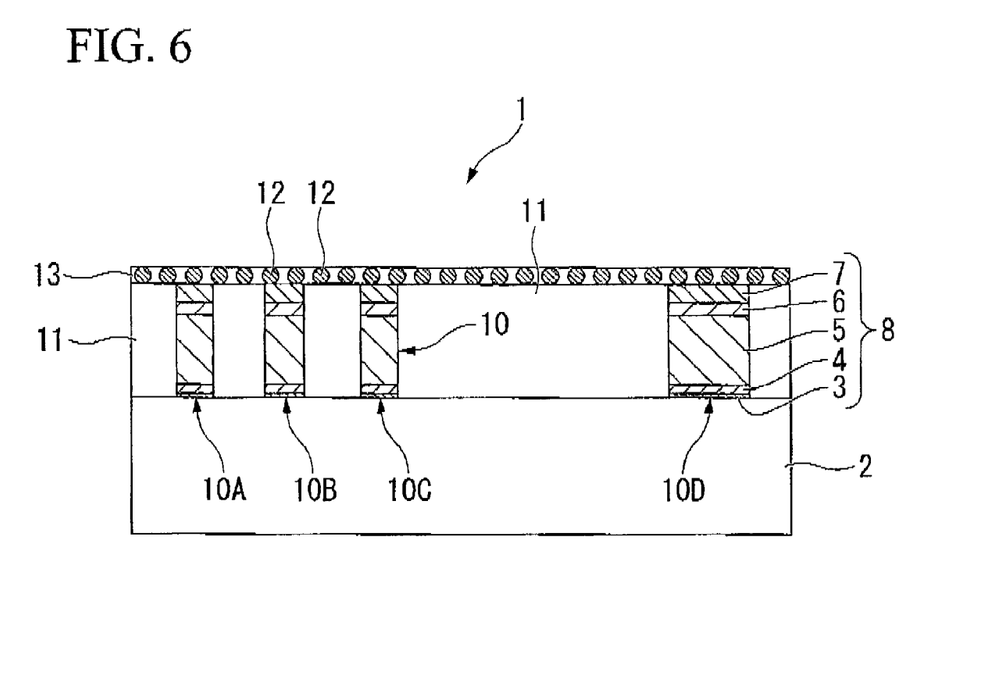
FIG. 6 is a process diagram for fabricating the semiconductor device related to the first embodiment of this invention and is a sectional view showing the state of the coating film being coated.

Next, as shown in FIG. 6, material which is the coating interlayer insulating film material (SOG: Spill on Class) mixed with 0.01-50% of nano particles, is coated on the planarized surface of substrate 1 by the SOD method to form a coating film 13. The nano-particles are composed, for example, of 30 nm diameter silicon nano crystals.

It is preferable that the coating interlayer insulating film material can form a low dielectric constant film with a relative dielectric constant in the range of 2.8-4.1, and in this range, it is possible to further reduce the relative dielectric constant of the entire wiring layer film 11 to be in a range of 2.8-4.1.

The nano-particles 12 are not limited to silicon nano crystals. The nano particles 12 may be nano crystal particles of CdSe, ZnS or PbSe, or carbon balls.

It is desirable that the diameter of the nano particles 12 be in the range of 4-30 nm. Moreover, it is desirable that the density of the nano particles 12 in the coating film 13 be in the range of $1\times10^5$-$2\times10^6$ particles/cm$^2$. By using the nano particles 12 of this range with the previously described density, and using a method explained below, as shown in FIG. 7, it is possible to form longitudinally hole-shaped fine pores 14 between the wires 10 whose diameter A is smaller than its depth B.

Figure 7:
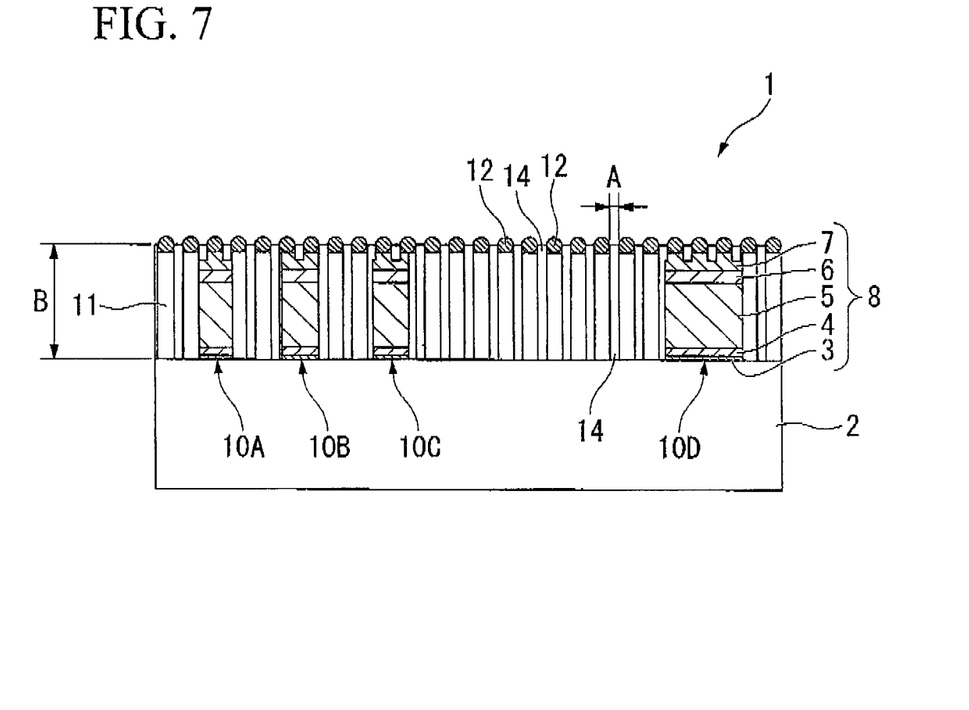
FIG. 7 is a process diagram for fabricating the semiconductor device related to the first embodiment of this invention and is a sectional view showing the state of fine pores being formed.

As shown in FIG. 7, with the nano particles 12 as a mask, anisotropically etch the wiring layer film 11 to form a plurality of longitudinally hole-shaped fine pores 14 among the wires 10 in the thickness direction of the wiring layer 8.

The diameter A of these fine pores 14 is almost equal to the width of the pattern 13a, that is, to the gap between the positions of the nano-particles 12. Because of this positioning, the relationship A<B is established with the diameter A sufficiently smaller than the depth B in the longitudinal direction, that is, the thickness of the wiring layer 8. The diameter A of the fine pore 14 may be, for example, in the range of 4 nm$\leq$A$\leq$30 nm. The depth B may be, for example, in the range of 420$\leq$B$\leq$500 nm.

By making the diameter A and the depth B be in the above-mentioned ranges, even when laminating various types of film and forming a plurality of vias (not illustrated) connecting the conductive films of the upper and lower layers, no risk of a short with adjacent vias exists and the design of the wires 10 becomes easy because of the lack of restrictions on the layout.

Figure 8:
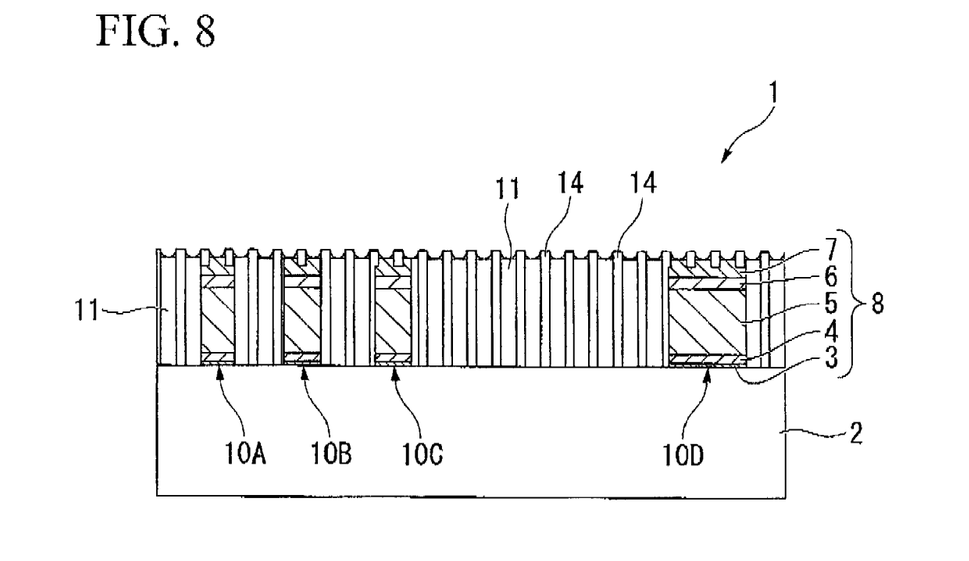
FIG. 8 is a process diagram for fabricating the semiconductor device related to the first embodiment of this invention and is a sectional view showing the state of nano-particles being eliminated.

Next, as shown in FIG. 8, the nano-particles 12 on the surface are eliminated by dry etching.

Figure 9:
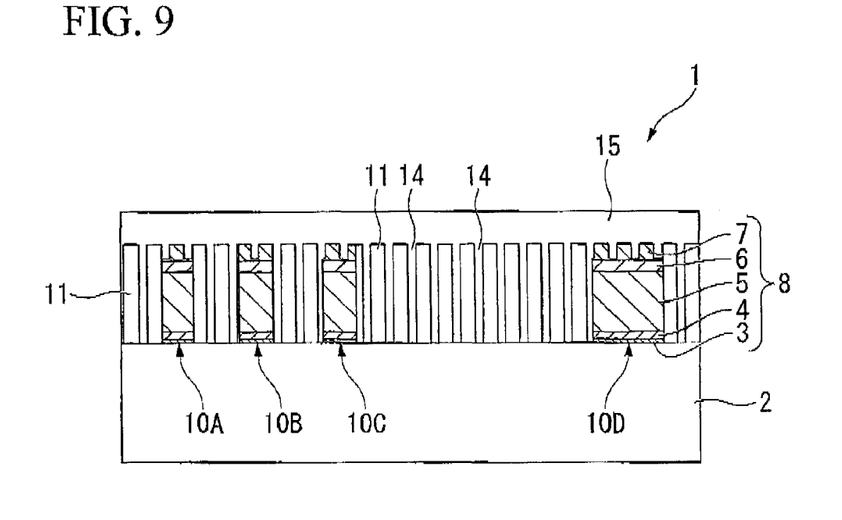
FIG. 9 is a process diagram for fabricating the semiconductor device related to the first embodiment of this invention and is a sectional view showing the state of a silicon oxide film being deposited.

Furthermore, using, for example, the CVD (Chemical Vapor Deposition) method, as shown in FIG. 9, a silicon oxide film 15 is deposited on the surface of the substrate 1.

The silicon oxide film 15 formed by using the CVD method has coverage characteristics with aspect ratios of about 2. Because of the coverage characteristics, deposition is principally on top of the fine pores 14 and cavities of the fine pores 14 are maintained because the proportion of deposition within the fine pores 14 is small.

In the wiring interlayer film 11, the fine pores 14 are cavities and contain air in their inside, and thus, the relative dielectric constant of the fine pores 14 is 1. The relative dielectric constant of the non-cavity portion is the relative dielectric constant of the silicon oxide film, and therefore, the relative dielectric constant of the non-cavity portion lies in the range of 3.9-4.1. Thus, by increasing the density of the fine pores 14, the relative dielectric constant of the entire wiring interlayer film 11 can be reduced.

The density of the fine pores 14 is proportional to the gap density of the nano-particles 12 used as a mask when etching. Consequently, by adjusting the density of the nano-particles 12 in the coating film 13, that is, by adjusting the concentration of the nano-particles within the coating interlayer insulating film material, the dielectric constant of the wiring interlayer film 11 can be adjusted.

As explained above, the fabrication process according to the first embodiment of the present invention, includes a process which forms the conductive wiring layer 8, a process which forms the wiring pattern 10 on the wiring layer 8, a process which forms the insulative wiring interlayer film 11 among the wires 10A, 10B, 10C, and 10D of the wiring pattern 10, and a process which forms a plurality of longitudinally hole-shaped fine pores 14 in the thickness direction of the wiring interlayer film 11. Because of this series of processes, it is possible to form in the wiring interlayer film 11a portion having a lower relative dielectric constant than that of the original insulating film. It is also possible to reduce the relative dielectric constant, as a whole, among the wires 10A, 10B, 10C, and 10D. Therefore, it is possible to reduce the capacitance among the adjacent wires 10A, 10B, 10C, and 10D, and as a result to suppress signal delays.

In addition, by forming a wiring structure using the above-mentioned fabrication method on the substrate 1 of the semiconductor device, the relative dielectric constant of the wiring interlayer film 11 can be reduced. Therefore, the wiring capacitance is reduced, and thereby signal delays are suppressed. As a result, enhancement of device speed can be achieved.

Second Embodiment

An explanation is given, with reference to FIGS. 10-15, of a wiring structure and a semiconductor device and their fabrication methods of a second embodiment of this invention. The processes up to forming the wiring interlayer film are the same as those used for the first embodiment.

Figure 10:
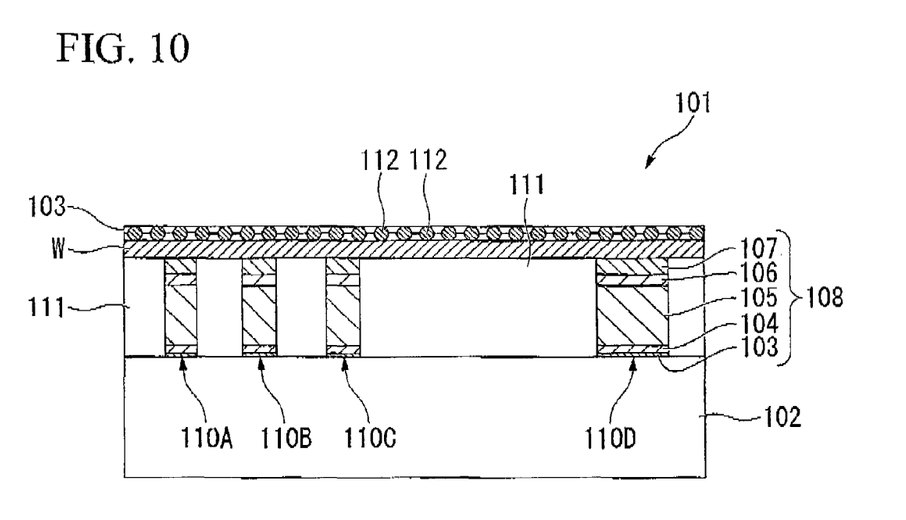
FIG. 10 is a process diagram for fabricating the semiconductor device related to a second embodiment of this invention and is a sectional view showing the state of a coating film being coated after a tungsten film is deposited.

As shown in FIG. 10, after completing a stacked-type memory cell fabrication process in DRAM (Dynamic Random Access Memory), an insulating film 102 is deposited on a substrate 101 as an insulating film on the capacitor plate electrode and a wiring layer 108 is formed on the insulating film 102. The wiring layer 108 is foamed by depositing, in sequence, a Ti film 103, a first TiN film 104, a conductive film 105 composed of aluminum, a second TiN film 106 and a silicon nitride film 107. By etching the wiring layer 108, wires 110A, 110B, 110C, and 110D of a wiring pattern 110 are formed. A wiring interlayer film 111 is formed between the wires 110A, 110B, 110C, and 110D. All heights of the wiring interlayer film 111 are made uniform.

The conductive film 105 is only required to be conductive and it is also possible to use metal such as copper in place of aluminum.

A tungsten layer W is formed by depositing, for example, 50 nm of tungsten on the entire surface of the substrate 101.

The material which is the coating interlayer insulating film material (SOG) mixed with nano-particles 112, is coated on the tungsten layer W using the SOD method to form a coating film 113. The nano-particles 112 are composed, for example, of 30 nm diameter silicon nano crystals.

It is preferable that the coating interlayer insulating film material can form low dielectric constant layers with relative dielectric constants in the range of 2.8-4.1 and in this range, it is possible to further reduce the relative dielectric constant of the entire wiring interlayer film 111 to be in a range of 2.8-4.1.

The nano-particles 112 are not limited to silicon nano crystals. The nano particles 112 may be nano crystal particles of CdSe or ZnS or PbSe, or carbon nano balls.

It is desirable that the diameter of the nano particles 112 be in the range of 4-30 nm. It is also desirable that the density of the nano-particles 112 in the coating film 113 be in the range of $1 \times 10^5$-$2 \times 10^6$ particles/cm$^2$. By using the nano particles 112 of this ranges as shown in FIG. 11, with the next explanation, it is possible to form longitudinal hole-shaped fine pores 114 whose diameter A1 is smaller than its depth B1.

Figure 11:
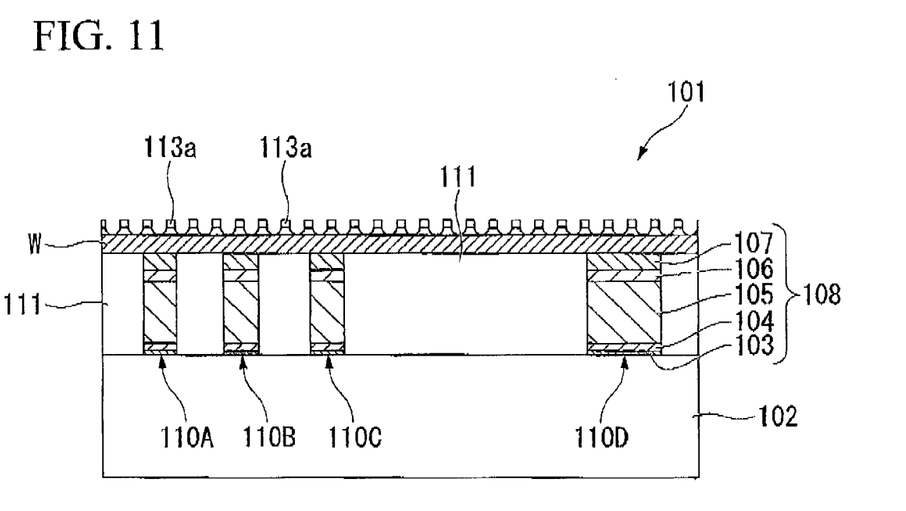
FIG. 11 is a process diagram for fabricating the semiconductor device related to the second embodiment of this invention and is a sectional view showing the state of nano-particles being eliminated.

Next, as shown in FIG. 11, the nano particles 112 on the surface are eliminated by dry etching, forming a pattern 113a on the coating film 113.

Figure 12:
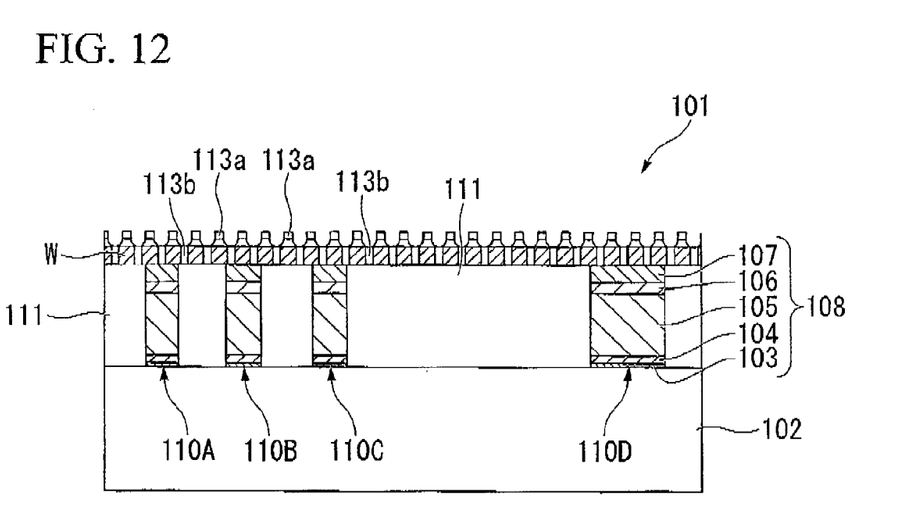
FIG. 12 is a process diagram for fabricating the semiconductor device related to the second embodiment of this invention and is a sectional view showing the state of the tungsten film being etched.

Then, as shown in FIG. 12, with the pattern 113a as a mask, the tungsten film W is anisotropically etched.

Figure 13:
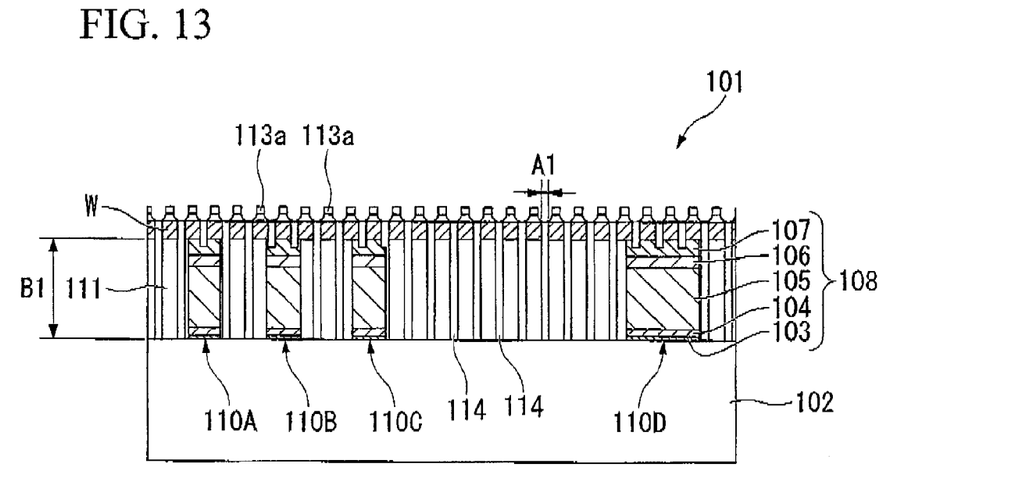
FIG. 13 is a process diagram for fabricating the semiconductor device related to the second embodiment of this invention and is a sectional view showing the state of fine pores being formed.

Furthermore, as shown in FIG. 13, with the pattern 113a and the tungsten layer W as a mask, the wiring interlayer film 111, which is a silicon oxide film, is anisotropically etched. From the etching, it is possible to form a plurality of longitudinally hole-shaped fine pores 114 in the thickness direction of the w layer 108 among wires 110A, 110B, 110C, and 110D of the wiring pattern 110.

Because the diameter A1 of the fine pores 114 is proportional to the diameter of the nano-particle 112, a relationship is established of A1<B1, with A1 sufficiently smaller than the longitudinal depth B1 (thickness of the wiring layer 108). The diameter A1 of the fine pores 114 may be, for example, in the range of 4 nm$\leq$A1$\leq$30 nm. The depth B1 of the fine pores 114 may be, for example, in the range of 420 nm$\leq$B1$\leq$500 nm.

By making the diameter A1 and the depth B1 be in the above-mentioned ranges, there is no risk of a short with adjacent vias (not illustrated) and there are no restrictions for layouts, and therefore, it becomes easier to design the wiring pattern 110.

Figure 14:
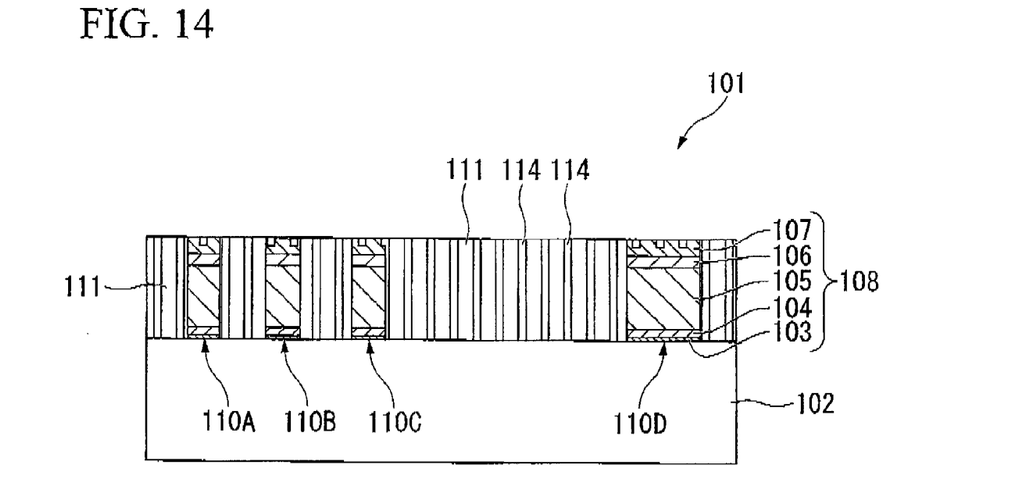
FIG. 14 is a process diagram for fabricating the semiconductor device related to the second embodiment of this invention and is a sectional view showing the state of the tungsten film being eliminated.

Next, as shown in FIG. 14, the tungsten layer W of the surface is eliminated by dry etching.

Figure 15:
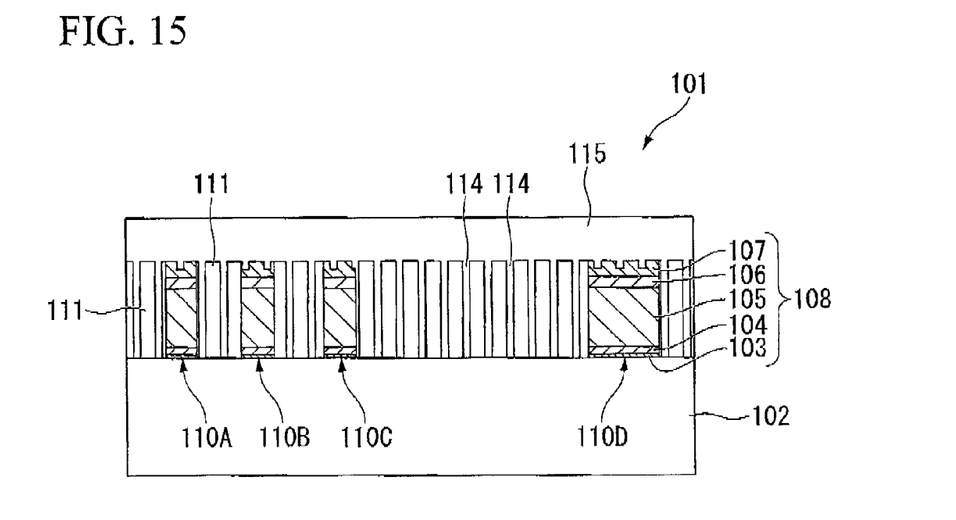
FIG. 15 is a process diagram for fabricating the semiconductor device related to the second embodiment of his invention and is a sectional view showing the state of a silicon oxide film being deposited.

Then, as shown in FIG. 15, by using the CVD method, a silicon oxide film 115 is deposited on the surface of the substrate 101. The silicon oxide film 115 formed by using the COD method has coverage characteristics with an aspect ratio of about 2. Because of these characteristics, deposition is principally on the top of the fine pores 114, and thus, cavities of the fine pores 114 are maintained.

In the wiring interlayer film 111, the relative dielectric of the fine pores 114 is 1 which are cavity portions. The relative dielectric constant of the non-cavity portion has the relative dielectric constant of the silicon oxide film. Thus, the relative dielectric constant of the non-cavity portion is in the range of 3.9-4.1. Consequently, by increasing the density of the fine pores 114, it is possible to reduce the relative dielectric constant of the entire wiring interlayer film 111.

The density of the fine pores 114 is the density of the nano-particles 112 used as a mask when etching. By adjusting the density of the nano-particles 112 in the coating film 113, that is, by adjusting the concentration of the nano-particles 112 within the coating interlayer insulating film material, it is possible to adjust the dielectric constant of the wiring interlayer film 111.

As explained above, the fabrication process according to the second embodiment of the present invention, includes a process which forms the conductive wiring layer 118, a process which forms the wiring pattern 110 on the wing layer 118, a process which forms the insulative wiring interlayer film 111 between the wires 110A, 110B, 110C, and 110D of the wiring pattern 110, and a process which forms a plurality of longitudinally hole-shaped fine pores 114 in the thickness direction of the wiring interlayer film 111. Because of this series of processes, it is possible to form in the wiring interlayer film 111 a portion having a lower relative dielectric constant than that of the original insulating film. It is also possible to reduce the relative dielectric constant, as a whole, among the wiles 110A, 110B, 110C, and 110D. Therefore, it is possible to reduce the capacitance among the adjacent wires 110A, 110B, 110C, and 110D, and as a result, to suppress signal delays.

In addition, by forming a wiring structure using the above-mentioned fabrication method on the substrate 101 of the semiconductor device, the relative dielectric constant of the wiring interlayer film 111 can be reduced. Therefore, the wiring capacitance is reduced, and thereby signal delays are suppressed. As a result, enhancement of device speed can be achieved.

Third Embodiment

An explanation is given, with reference to FIGS. 16-19, of a wiring structure and a semiconductor device and their fabrication methods of a third embodiment of this invention. The processes up to forming the wiring interlayer film are the same as those used for the first embodiment.

Figure 16:
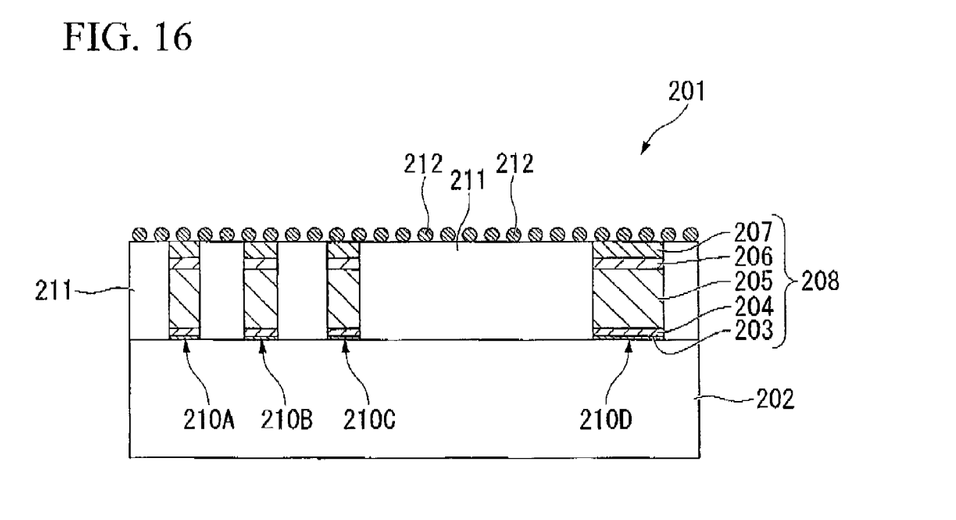
FIG. 16 is a process diagram for fabricating the semiconductor device related to a third embodiment of this invention and is a sectional view showing the state of nano-particles being deposited.

As shown in FIG. 16, after completing a stacked-type memory cell fabrication process in. DRAM (Dynamic Random Access Memory), an insulating film 202 is deposited on a substrate 201 as an insulating film on the capacitor plate electrode and a wiring layer 108 is formed on the insulating film 202. The wiring layer 208 is formed by depositing, in sequence, a Ti film 203, a first TiN film 204, a conductive film 205 composed of aluminum, a second TiN film 206 and a silicon nitride film 207. By etching the wiring layer 208, wires 210A, 210B, 210C, and 210D of a wiring pattern 210 are formed. A wiring interlayer film 211 is formed between the wires 210A, 210B, 210C, and 210D. All heights of the wiring interlayer film 211 are made uniform.

The conductive film 205 is only required to be conductive and it is also possible to use metal such as copper in place of aluminum.

Nano-particles 212 are then deposited on the substrate 201.

The nano-particles 212 can be deposited by, for examples placing the substrate 201 in an atmosphere of approximately 1 mTorr in a VHF (Very High Frequency) plasma with using silane and hydrogen as raw materials. By using this depositing method, it is possible to deposit nano-particles 212 composed of silicon nano crystals having a diameter of 30 nm.

The nano particles 212 which are deposited on the surface of the substrate 201 (the wiring interlayer film 211) are not limited to silicon nano crystals. The nano particles 212 may be nano crystal particles such as with CdSe, ZnS or PbSe, or carbon balls.

It is preferable that the diameter of the nano particles 212 be in the range of 4-30 nm. By using the nano particles 212 in this range, as shown in FIG. 17, with the next explanation, it is possible to form longitudinal hole-shaped fine pores 214 whose diameter A2 is smaller than its depth B2.

Figure 17:
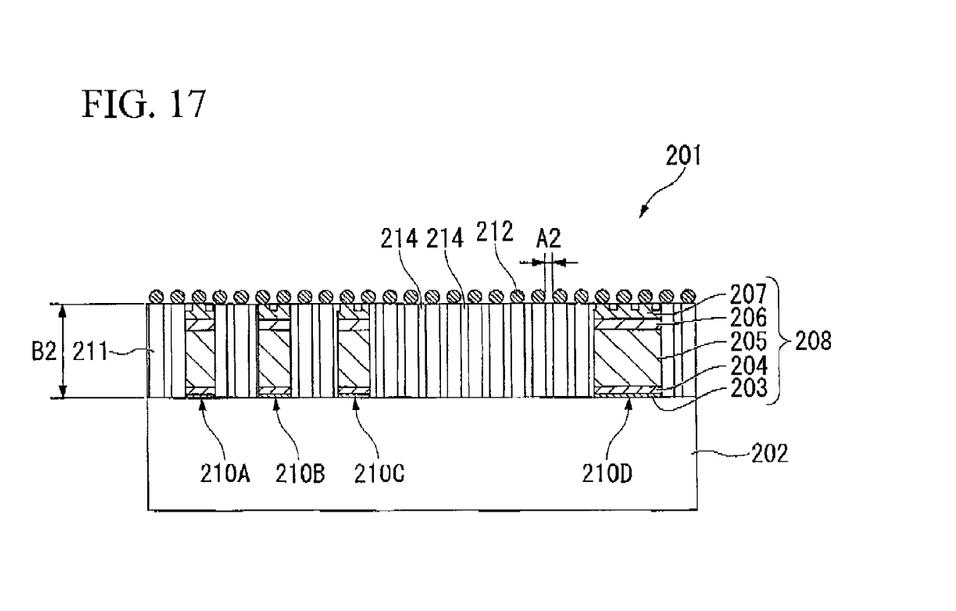
FIG. 17 is a process diagram for fabricating the semiconductor device related to the third embodiment of his invention and is a sectional view showing the state of fine pores being formed.

Next, as shown in FIG. 17, the wiring interlayer film 211 which is a silicon oxide film is anisotropically etched with the nano-particles 212 used as a mask to form, between the wires 210, a plurality of longitudinally hole-shaped fine pores 214 in the thickness direction of the wiring layer 208.

The diameter A2 of the fine pores 214, because the diameter is equal to the gap among the nano-particles 212, is sufficiently small compared to the depth B2 in the longitudinal direction, that is, the thickness of the wiring layer 208. Thus, the relationship A2<B2 is established.

The diameter A2 of the fine pores 214 may be in the range, for example, of 4 nm$\leqq$A2$\leqq$30 nm. The depth B2 of the fine pores 214 may be in the range, for example, of 420 nm$\leqq$B2$\leqq$500 nm.

By making the diameter A2 and the depth B2 be in the above-mentioned ranges, there is no risk a short with adjacent vias (not illustrated) and there are no restrictions for the layout, and therefore, it becomes easier to design the wiring pattern 210.

Figure 18:
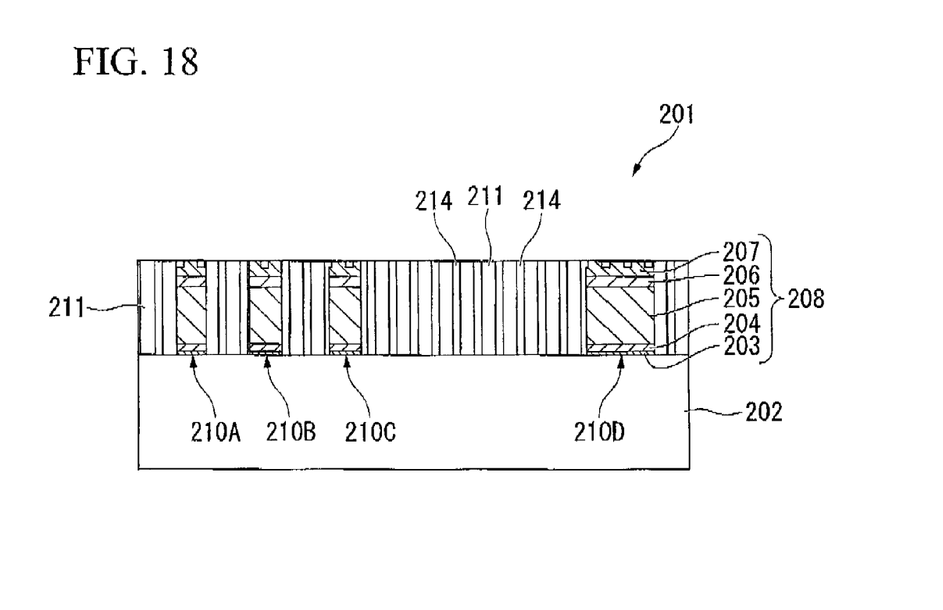
FIG. 18 is a process diagram for fabricating the semiconductor device related to the third embodiment of this invention and is a section view showing the state of the nano-particles being eliminated.
Figure 19:
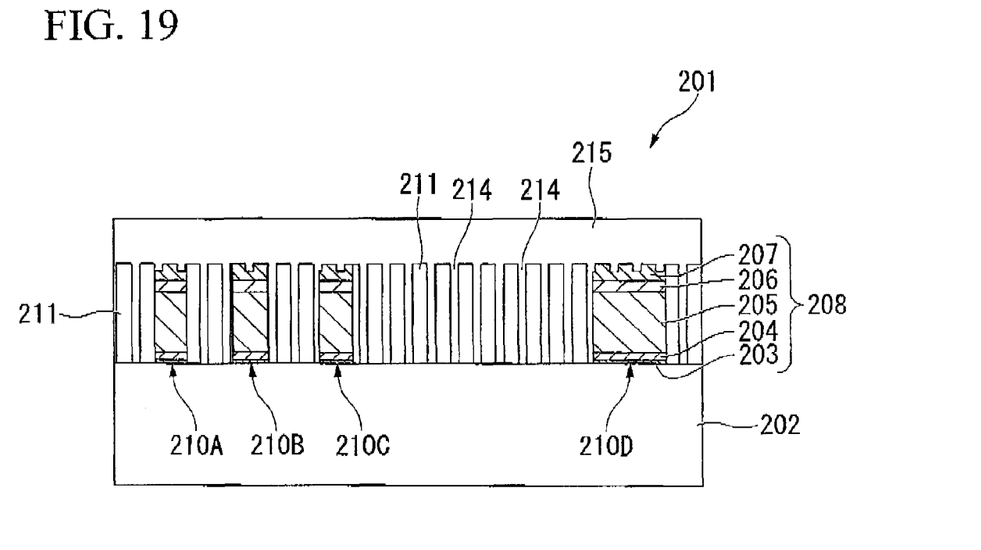
FIG. 19 is a process diagram for fabricating the semiconductor device related to the third embodiment of this invention and is a sectional view showing the state of a silicon oxide film being deposited.

Next, as shown in FIG. 18, the nano-particles 212 on the surface are eliminated by dry etching. As shown in FIG. 19, by using the CVD method, the silicon oxide film 215 is deposited on the surface of the substrate 201.

The silicon oxide film 215 formed by using the CVD method, has coverage characteristics with an aspect ratio of about 2. Because of these characteristics, the silicon oxide film 215 is principally deposited on top of the fine pores 214 and the cavities of the fine pores 214 are maintained. The relative dielectric constant of the cavity portions is 1.

In the wiring interlayer film 211, the relative dielectric constant of the fine pores 214 which are the cavity portions, is 1. The relative dielectric constant of the non-cavity portion is the relative dielectric constant of the silicon oxide film, and therefore, the relative dielectric constant of the non-cavity portion is 3.9-4.1. Thus, by making the density of the fine pores 214 large, the relative dielectric constant of the entire wiring interlayer film 211 can be reduced.

The density of the fine pores 214 is the gap density of the nano-particles 212 used as a mask when etching. Thus, by adjusting the density of the nano-particles 212 disposed on the wiring interlayer film 211, it is possible to adjust the dielectric constant of the film 211 between the wiring layers.

As explained above, the fabrication process according to the third embodiment of the present invention, includes a process which forms the conductive wiring layer 208, a process which forms the wiring pattern 210 on the wiring layer 218, a process which forms the insulative wiring interlayer film 211 among the wires 210A, 210B, 210C, and 210D of the wiring pattern 210, and a process which forms a plurality of longitudinal hole-shaped fine pores 214 in the thickness direction of the wiring interlayer film 211. Because of this series of processes, it is possible to form in the wiring interlayer film 211a portion having a lower relative dielectric constant than that of the original insulating film and it is possible to reduce the relative dielectric constant as a whole between the wires 210. Thus, it is possible to reduce the capacitance among the adjacent wires 210A, 210B, 210C, and 210D.

In addition, by forming a wiring structure using the above-mentioned fabrication method on the substrate 201 of the semiconductor device, it is possible to reduce the relative dielectric constant of the wiring interlayer film 211. Therefore, the wiring capacitance is reduced, and as a result, signal delays are suppressed. As a result enhancement of device speed can be achieved.

INDUSTRIAL CAPABILITY

The present invention can be applied to, for example, the wiring structures of semiconductor devices such as DRAM, or the wiring structures of semiconductor memory elements.

What is claimed is:

1. A fabrication method of a wiring structure, comprising:
   forming a wiring pattern over a semiconductor substrate;
   forming a first insulating film on the wiring pattern, the first insulating film being filled between wires of the wiring pattern;
   forming a mask layer by using a coating interlayer insulating film which includes nano particles;
   removing a part of the first insulating film to form a plurality of pores in the first insulating film by using the mask layer as an etching mask;
   removing the mask layer; and
   forming a second insulating film on the first insulating film to cover the plurality of pores, wherein a plurality of cavities remain in the first insulating film.

2. The fabrication method according to claim 1, wherein removing the mask layer comprises removing the nano particles from a surface of the first insulating film by dry etching.

3. The fabrication method according to claim 1, wherein a material of the nano particles is selected from a group of Si, CdSe, ZnS, PbSe and carbon balls.

4. The fabrication method according to claim 1, wherein a diameter of each of the nano particles is in a range from 4 nm to 30 nm.

5. The fabrication method according to claim 1, wherein the coating interlayer insulating film includes 0.01% to 50% of the nano particles.

6. The fabrication method according to claim 1, wherein forming the mask layer comprises:
   forming a tungsten layer on the first insulating film;
   removing the nano particles from the coating interlayer insulating film by dry etching; and
   removing a part of the tungsten layer by using remaining part of the coating interlayer insulating film as an etching mask.

7. The fabrication method according to claim 6, wherein removing the mask layer comprises removing the tungsten layer from a surface of the first insulating film by dry etching.

8. The fabrication method according to claim 6, wherein a material of the nano particles is selected from a group of Si, CdSe, ZnS, PbSe and carbon balls.

9. The fabrication method according to claim 6, wherein a diameter of each of the nano particles is in a range from 4 nm to 30 nm.

10. The fabrication method according to claim 6, wherein the coating interlayer insulating film includes 0.01% to 50% of the nano particles.

11. The fabrication method according to claim 1, wherein forming the first insulating film comprises:
    forming a SOD film over the wiring pattern by coating method; and flattening a surface of the SOD film by using CMP method.

12. The fabrication method according to claim 1, wherein the second insulating film is formed on top of the plurality of pores in the first insulating film and the plurality of cavities are formed so that the plurality of pores contain air in their inside.

* * * * *